United States Patent
Li et al.

(10) Patent No.: US 9,786,698 B2
(45) Date of Patent: Oct. 10, 2017

(54) LIQUID CRYSTAL DISPLAY DEVICE AND MANUFACTURING METHOD THEREOF

(71) Applicants: Shanghai Tianma Micro-Electronics Co., Ltd., Shanghai (CN); Tianma Micro-Electronics Co., Ltd., Shenzhen (CN)

(72) Inventors: Jialing Li, Shanghai (CN); Feng Lu, Shanghai (CN); Jun Ma, Shanghai (CN); Sitao Huo, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/742,696

(22) Filed: Jun. 17, 2015

(65) Prior Publication Data

US 2016/0148957 A1    May 26, 2016

(30) Foreign Application Priority Data

Nov. 20, 2014 (CN) .......................... 2014 1 0667863

(51) Int. Cl.
*H01L 27/12* (2006.01)
*G02F 1/1362* (2006.01)
*G02F 1/1333* (2006.01)
*G02F 1/1337* (2006.01)

(52) U.S. Cl.
CPC .... *H01L 27/1262* (2013.01); *G02F 1/136286* (2013.01); *H01L 27/124* (2013.01); *G02F 1/133345* (2013.01); *G02F 1/133788* (2013.01); *G02F 2001/136295* (2013.01)

(58) Field of Classification Search
CPC .......................... G02F 1/13306; H01L 29/7869
See application file for complete search history.

(56) References Cited

U.S. PATENT DOCUMENTS

2007/0058115 A1\* 3/2007 Utsumi ............ G02F 1/133514
349/109

FOREIGN PATENT DOCUMENTS

| CN | 101533176 B | 5/2012 |
| CN | 102279487 B | 8/2013 |
| JP | 2012069842 A | 4/2012 |

\* cited by examiner

*Primary Examiner* — Fernando L Toledo
*Assistant Examiner* — Lawrence-Linh T Nguyen
(74) *Attorney, Agent, or Firm* — Alston & Bird LLP (57) ABSTRACT

A liquid crystal display device is disclosed. The liquid crystal display device includes a first substrate, a second substrate opposite of the first substrate, and a TFT layer on the first substrate. The TFT layer includes a gate electrode metal layer, and a source/drain electrode metal layer, where the source/drain electrode metal layer overlaps the gate electrode metal layer. The display device also includes an alignment film layer on a side of the first substrate that faces the second substrate, and on a side of the second substrate that faces the first substrate. The display device also includes at least one protrusion on at least a part of a side of at least one of the gate electrode metal layer and the source/drain electrode metal layer that faces the first substrate, where the protrusion is configured to reflect incident light from a side of the first substrate.

16 Claims, 10 Drawing Sheets

LIQUID CRYSTAL DISPLAY DEVICE AND MANUFACTURING METHOD THEREOF

CROSS-REFERENCES TO RELATED APPLICATIONS

This application claims the benefit of priority to Chinese Patent Application No. 201410667863.4, filed with the Chinese Patent Office on Nov. 20, 2014 and entitled "LIQUID CRYSTAL DISPLAY DEVICE AND MANUFACTURING METHOD THEREOF", the content of which is incorporated herein by reference in its entirety.

TECHNICAL FIELD

The present disclosure relates to a liquid crystal display device and a manufacturing method thereof, in particular to a liquid crystal display device manufactured by a photo-alignment process and a manufacturing method thereof.

BACKGROUND OF THE INVENTION

In a liquid crystal display device, a voltage is applied across two substrates to apply an electric field to a liquid crystal layer sandwiched between the two substrates, and thus liquid crystal molecules within the liquid crystal layer are deflected under the effect of the electric field so that the liquid crystal layer has a light transmittance corresponding to the electric field, thereby displaying pictures of different gray scales complying with the strength of the electric field. Additionally, to provide the liquid crystal molecules with a stable boundary condition in order to induce the liquid crystal molecules to be oriented in a certain direction, an alignment layer is formed on a surface of at least one substrate contacting with the liquid crystal layer. To enable the alignment layer to produce an alignment effect in a certain direction, a known method is to rub the alignment layer with a contact-type process, which, however, might scratch the alignment layer or cause pollution by particles. Thus, a contactless alignment process, for example a photo-alignment process, is proposed. In the photo-alignment process, linear polarized light irradiates the alignment layer to produce an alignment effect. The incident direction of the linear polarized light can determine the alignment direction of the alignment layer, and an included angle between the incident direction of the linear polarized light and the alignment layer may affect a pretilt angle of the liquid crystal molecules after the photo-alignment.

In the existing photo-alignment process, after both of the substrates are irradiated with light so that the liquid crystal molecules are oriented to an initial pretilt angle, both of the substrates processed to form a resultant liquid crystal cell. However, steps of such process are relatively complicated and cause a high cost.

BRIEF SUMMARY OF THE INVENTION

One inventive aspect is a liquid crystal display device. The liquid crystal display device includes a firsts substrate, a second substrate opposite to the first substrate, and a TFT layer on the first substrate. The TFT layer includes a gate electrode metal layer, and a source/drain electrode metal layer, where the source/drain electrode metal layer overlaps the gate electrode metal layer. The display device also includes an alignment film layer on a side of the first substrate that faces the second substrate, and on a side of the second substrate that faces the first substrate. The display device also includes at least one protrusion on at least a part of a side of at least one of the gate electrode metal layer and the source/drain electrode metal layer that faces the first substrate, where the protrusion is configured to reflect incident light from a side of the first substrate.

Another inventive aspect is a method for manufacturing a liquid crystal display device. The method includes providing first and second substrates, where the second substrate is opposite to the first substrate. The method also includes forming a color filter layer and a black matrix layer on the second substrate, and forming a TFT layer on the first substrate, where the TFT layer includes a gate electrode metal layer, and a source/drain electrode metal layer. The source/drain electrode metal layer overlaps the gate electrode metal layer, where wherein at least one protrusion is on at least a part of a side of at least one of the gate electrode metal layer and the source/drain electrode metal layer that laces the first substrate, and where the protrusion is configured to reflect incident light from a side of the first substrate. The method also includes forming an alignment film layer on the TFT layer and on the second substrate, arranging the first substrate and the second substrate to form a liquid crystal cell and starting irradiation by polarized light onto a side of the first substrate to supply an alignment energy to the alignment film layer.

BRIEF DESCRIPTION OF THE DRAWINGS

In order in more clearly illustrate technical solutions in embodiments of the present invention, accompanying drawings used in the embodiments will be introduced briefly below. Obviously, the accompanying drawings described below illustrate merely some examples of the disclosure and other drawings can be further obtained by those ordinary skilled in the art without creative work from the accompanying drawings, in which.

DETAILED DESCRIPTION OF THE INVENTION

The technical solutions in the embodiments of the present invention are clearly and completely described below in combination with the accompanying drawings. Obviously, the described embodiments illustrate some instead of all embodiments of the present invention. Other embodiments obtained in light of the described embodiments of the invention by those skilled in the art without any creative work should fall within the scope of the present invention.

Figure 1:
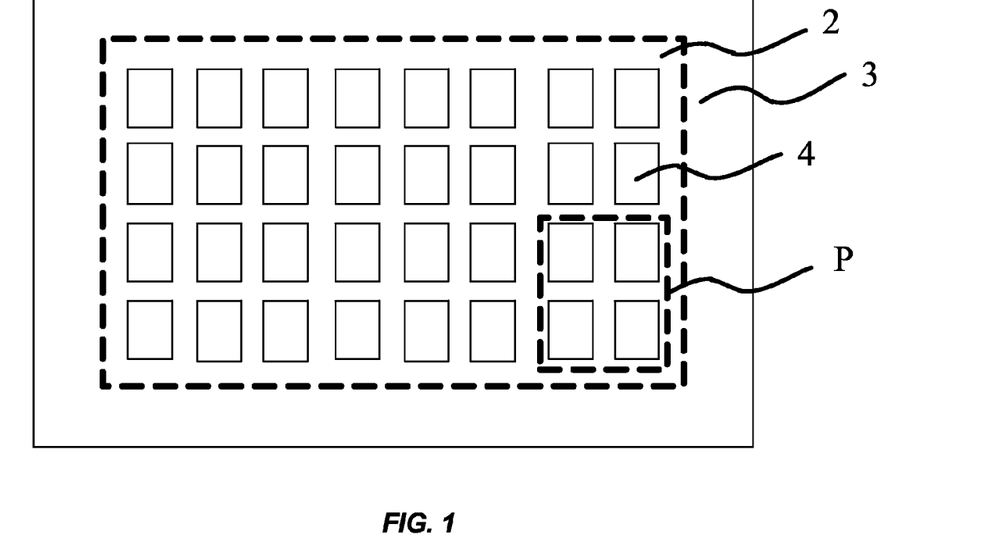
FIG. 1 is a top view showing a pixel structure of a liquid crystal display device.

FIG. 1 is a top view showing a pixel structure of a liquid crystal display device 1. The liquid crystal display device 1 includes a display region 2 and a peripheral region 3 surrounding the display region 2, where a plurality of pixel units 4 are provided in the display region 2.

Figure 2:
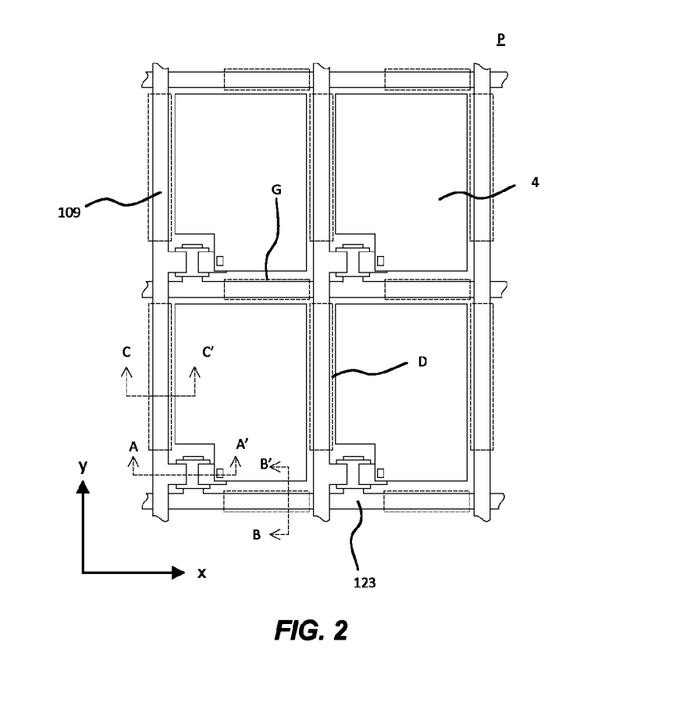
FIG. 2 is an enlarged partial view of the liquid crystal display device according to an embodiment of the present disclosure.

FIG. 2 is an enlarged partial view of a region P of the liquid crystal display device 1. As shown in FIG. 2, four adjacent pixel units 4 are defined by gate lines 123 and data lines 109, where the gate lines 123 extend along a direction x and are arranged in parallel along a direction y, and the data lines 109 extend along the direction y and are arranged in parallel along the direction x.

Figure 3:
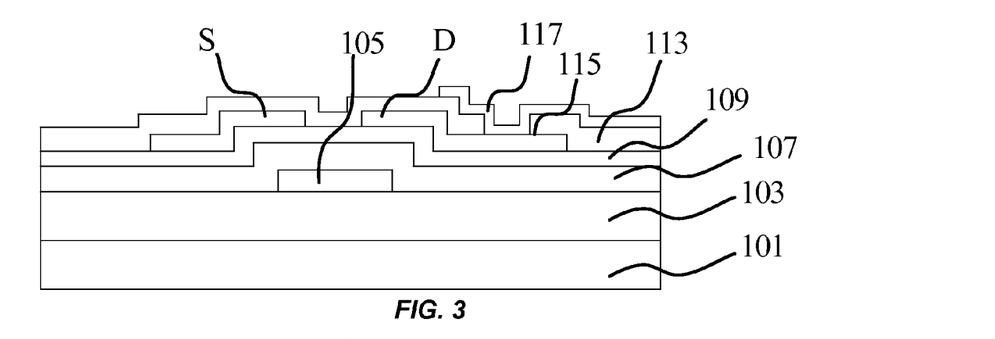
FIG. 3 shows a cross-section of the pixel structure taken along a line AA' in FIG. 2.

FIG. 3 is a cross-section of the overlapped structure of a first substrate 101 and a TFT layer taken along a line AA' in FIG. 2, and the cross-section shows: a first substrate 101, a first insulation layer 103 disposed on the first substrate 101, a gate electrode 105 disposed on the first insulation layer 103, a gate electrode insulation layer 107 disposed on the gate electrode 105, a semiconductor layer 109 disposed on the gate electrode insulation layer 107, a source/drain metal layer 111 disposed on the semiconductor layer 109, a passivation layer 113 disposed on the source/drain metal layer 111, and a pixel electrode layer 117 disposed on the passivation layer 113, where the source/drain metal layer 111 includes a source electrode S and a drain electrode D, the passivation layer 113 includes a first via 115 exposing a part of the source/drain metal layer 111, and the pixel electrode layer 117 is electrically connected with the source electrode S or the drain electrode D through the first via 115.

Figure 4:
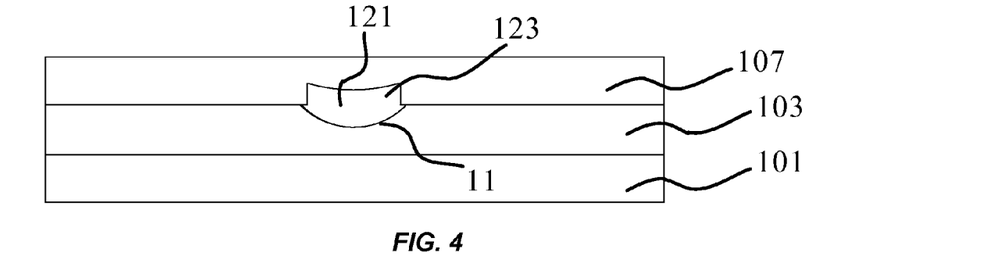
FIG. 4 shows a cross-section of the pixel structure taken along a line BB' in FIG. 2.

FIG. 4 is a cross-section of the overlapped structure of the first substrate 101 and the TFT layer taken along a line BB' in FIG. 2, and the cross-section shows: the first substrate 101; the first insulation layer 103 disposed on the first substrate 101, where the first insulation layer 103 has a first groove 121 therein; a gate line 123 disposed on the first insulation layer 103, where the gate line 123 is located at the same layer as the gate electrode 105 in FIG. 3; and the gate electrode insulation layer 107 disposed above the gate line 123. In such pixel structure, due to the presence of the first groove 121 in the first insulation layer 103, a side of the gate line 123 disposed in the first groove 121, which faces the substrate 101, is provided with a first protrusion 11 having a shape corresponding to the shape of the first groove 121. As shown in FIG. 4, the gate line 123 includes only one such first protrusion 11 which is of an arc shape. In practice, the first protrusion 11 is not limited to the arc shape as shown in FIG. 4 and may have any other shape, and there may be more than one first protrusion 11, which is described in detail as below.

Figure 5:
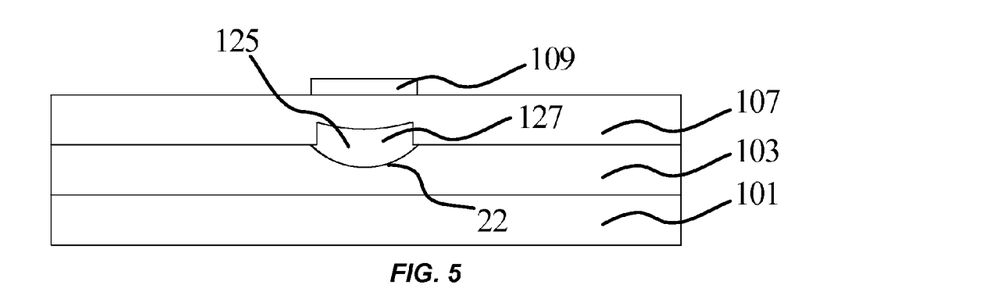
FIG. 5 shows a cross-section of the pixel structure taken along a line CC' in FIG. 2.

FIG. 5 is a cross-section of the overlapped structure of the first substrate 101 and the TFT layer taken along a line CC' in FIG. 2, and the cross-section shows: the first substrate 101; the first insulation layer 103 disposed on the first substrate 101, where the first insulation layer 103 has a second groove 125 therein, and a first metal line 127 is disposed in the second groove 125 and is located at the same layer as the gate electrode 105 in FIG. 3; the gate electrode insulation layer 107 disposed on the first metal line 127 and the first insulation layer 103; and a data line 109 disposed on the gate electrode insulation layer 107 and located at the same layer as the source/drain metal layer 111, and a projection of the data line 109 in a vertical direction (i.e. a direction perpendicular to the directions x and y) at least partly overlaps a projection of the first metal line 127 in the vertical direction. In such pixel structure, due to the presence of the second groove 125 in the first insulation layer 103, a side of the first metal line 127 disposed in the second groove 125, which faces the first substrate 101, is provided with a second protrusion 22 having a shape corresponding to the shape of the second groove 125. As shown in FIG. 5, the first metal line 127 includes only one second protrusion 22 of an arc shape. In practice, the second protrusion 22 is not limited to the arc shape as shown in FIG. 5 and may have other shape, and there may be more than one first metal line 127, which is described in detail as below.

Figure 6:
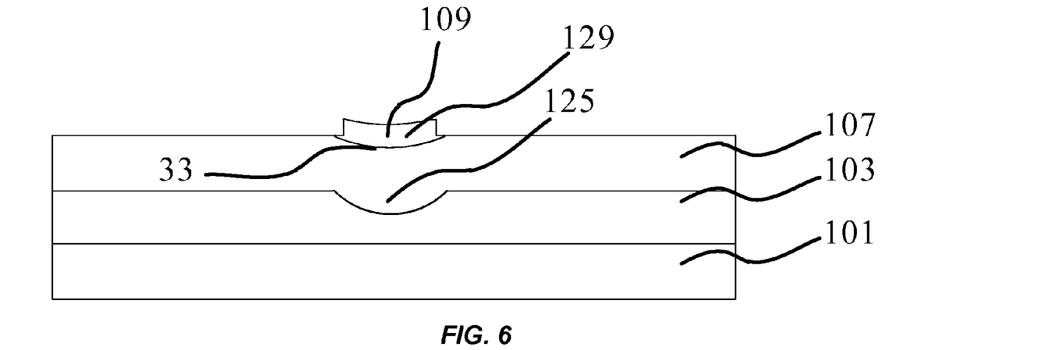
FIG. 6 shows another cross-section of the pixel structure taken along the line CC' in FIG. 2.

FIG. 6 is a cross-section of another overlapped structure of a first substrate 101 and a TFT layer taken along the line CC' in FIG. 2, and the cross-section shows: a first substrate 101; a first insulation layer 103 disposed on the first substrate 101, where the first insulation layer 103 has a second groove 125 therein; a gate electrode insulation layer 107 disposed on the first insulation layer 103; and a data line 109 disposed on the gate electrode insulation layer 107 and located at the same layer as the source/drain metal layer 111. In such pixel structure, due to the presence of the gate electrode insulation layer 107 on the first insulation layer 103 and the arrangement of the second groove 125 in the first insulation layer 103, a fake second groove (i.e. a groove resulting from the second groove 125) 129 having a shape similar to the shape of the second groove 125 is also disposed on the gate electrode insulation layer 107. Since the data line 109 is formed in the fake second groove 129, a side of the data line 109 which faces the first substrate 101 is provided with a third protrusion 33 corresponding to the fake second groove 129. As shown in FIG. 6, the data line 109 includes only one third protrusion 33 of an arc shape. In practice, the third protrusion 33 is not limited to the arc shape as shown in FIG. 6 and may have other shape, and there may be more than one third protrusion 33, which is described in detail as follow below.

Figure 7:
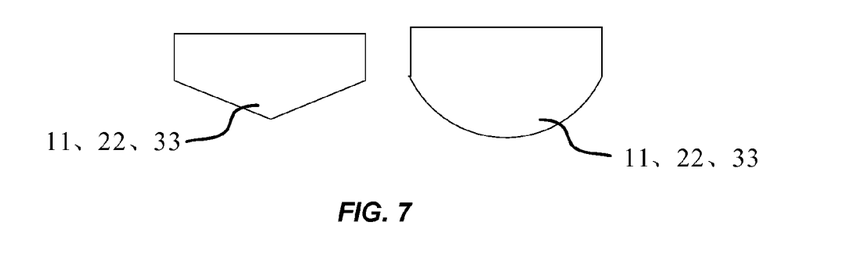
FIG. 7 is a schematic view showing shapes of a first protrusion, a second protrusion and a third protrusion.
Figure 8:
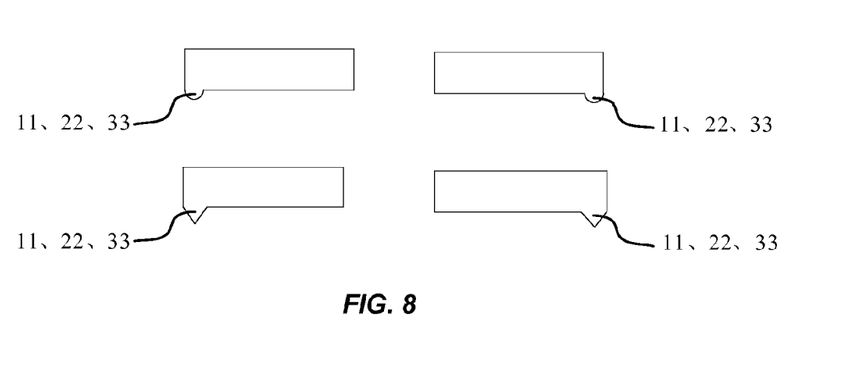
FIG. 8 is another schematic view showing shapes of the first protrusion, the second protrusion and the third protrusion.
Figure 9:
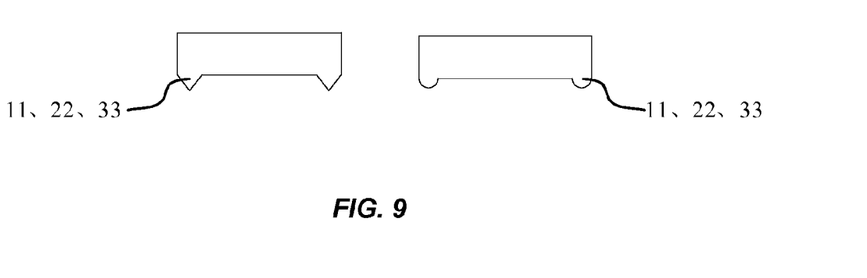
FIG. 9 is still another schematic view showing shapes of the first protrusion, the second protrusion and the third protrusion.
Figure 10:
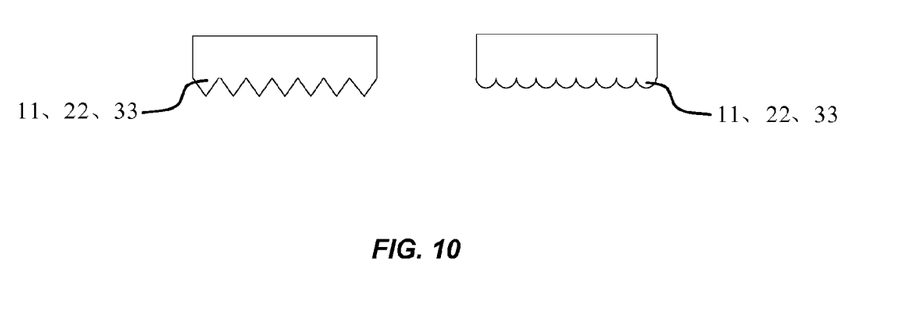
FIG. 10 is still another schematic view showing shapes of the first protrusion, the second protrusion and the third protrusion.

Next, the shape of the first protrusion 11, the second protrusion 22 and the third protrusion 33 in the above embodiments will be described in detail below to combination with those on the entire first substrate 101 shown in FIGS. 5, 6 and 7. Specifically, the number of the first protrusion 11, the number of the second protrusion 22 and the number of the third protrusion 33 may be one, respectively, the first, second and third protrusions 11, 22 and 33 may have a triangle shape or an arc shape, and the first protrusion 11, the second protrusion 22 and third protrusion 33 are respectively disposed on an entire surface of the gate line 123, an entire surface of the first metal line 127 and an entire surface of the data line 109 that face the first substrate 101. As shown in FIG. 7, the number of the first protrusion 11, the number of the second protrusion 22 and the number of the third protrusion 33 may be at least one, and the first, second and third protrusions 11, 22 and 33 have a triangle shape or a circular arc shape, and are respectively provided at an entire surface of the gate line 123, an entire surface the first metal line 127 and an entire surface the data line 109 that face the first substrate 101. Specifically, as shown in FIG. 8, the number of the first protrusion 11, the number of the second protrusion 22 and the number of the third protrusion 33 are one, and the first, second and third protrusions 11, 22 and 33 have a triangle shape or a circular arc shape, and are respectively provided at an edge (left edge or right edge) on a side of the gate line 123, a side of the first metal line 127 and a side of the data line 109 that face the first substrate 101. As shown in FIG. 9, the number of the first protrusions 11, the number of the second protrusions 22 and the number of the third protrusions 33 are two, and the first protrusions 11, second protrusions 22 and third protrusions 33 have a triangle shape or a circular arc shape, and are respectively provided at both edges on a side of the gate line 123, a side of the first metal line 127, and a side of the data line 109 that face the first substrate 101. As shown in FIG. 10, the number of the first protrusions 11, the number of the second protrusions 22 and the number of the third protrusions 33 are seven (which is illustrative herein, and any other number of the protrusions may be selected), and the first protrusions 11, the second protrusions 22 and the third protrusions 33 are distributed respectively on an entire surface on a side of the gate line 123, a side of the first metal line 127 and a side of the data line 109 that face the substrate 101.

FIGS. 7 to 10 show the ideal shapes of the gate line 123 with the first protrusion 11, the first metal line 127 with the second protrusion 22, and the data line 109 with the third protrusion 33. In practice, to form the first protrusion 11, the second protrusion 22 and the third protrusion 33, grooves (e.g. the first groove 121 and the second groove 125) are pre-etched on a film before forming the gate lines 123, the first metal lines 127 and the data lines 109, so that, because of the presence of the grooves (e.g. the first groove 121 and the second groove 125), when forming the gate lines 123, the first metal lines 127 and the data lines 109, the first protrusion 11, the second protrusion 22 and the third protrusion 33 are formed at a surface on a side of the gate line 123, a side of the first metal line 127 and a side of the data line 109 that face the first substrate 101, and further insignificant grooves are also formed in the corresponding location at a surface on a side of the gate line 123, a side of the first metal line 127 and a side of the data line 109 that are away from the first substrate 101, referring to the shape of the gate line 123, the first metal line 127 and the data line 90 as shown in FIGS. 4 to 6, which will not described herein. Therefore, FIGS. 7 to 10 merely show the ideal shapes of the gate line 123, the first metal line 127, and the data line 109 in order to specifically describe the shapes and the number of the protrusions.

Figure 11:
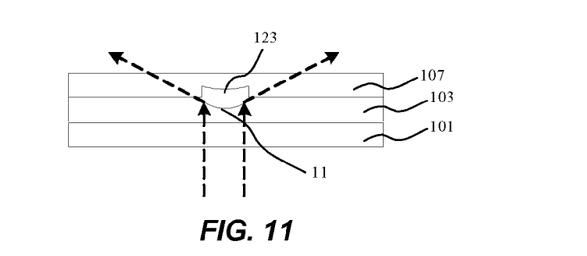
FIG. 11 is a schematic view showing light paths in an array substrate according to an embodiment of the present disclosure.

As such, the shape and the number of the first protrusion 11, the second protrusion 22 and the third protrusion 33 according to the above embodiments are so arranged that: since the first protrusion 11, the second protrusion 22 and the third protrusion 33 are made of metal when light irradiates the first protrusion 11, the second protrusion 22 and the third protrusion 33 from a side of the first substrate 101, particularly when the light irradiates the protrusions located at an edge of the gate line 123, the first metal line 127 and the data line 90, the protrusions can reflect the light to the peripheral regions of the gate line 123, the first metal line 127 and the data line 109. For example, the entire light path showing the transmission of the light in the structure shown in FIG. 5 is explained referring to FIG. 11, specifically, when light irradiates the gate lines 123 from a side of the first substrate 101 (e.g. a side of the first substrate 101 that is away from the first insulation layer 103 as shown in FIG. 11) in a direction perpendicular to the first substrate 101, the light cannot transmit through the surface of the gate lines 123 because the gate lines 123 are made of metal. In addition, a surface of the gate lines 123 that faces the first substrate 101 and a surface of the gate lines 123 that is away from the first substrate 101 are conventionally both planar without any protrusion, so that the light cannot even be reflected to any direction other than the opposite direction of the incidence direction of the incident light. However, if the gate lines 123 with the protrusion as show in FIG. 11 are employed, when irradiating the first protrusion 11, the light can be reflected to the peripheral region of the gate line 123.

Figure 12:
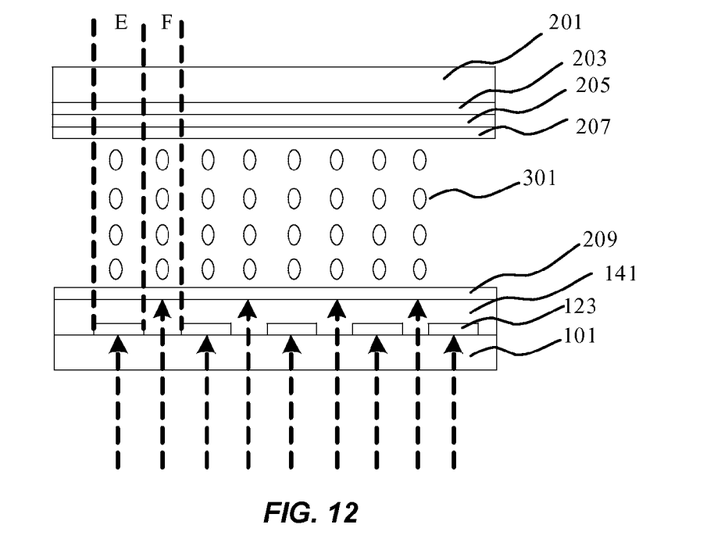
FIG. 12 is a schematic view showing light paths in a traditional liquid crystal display device.
Figure 13:
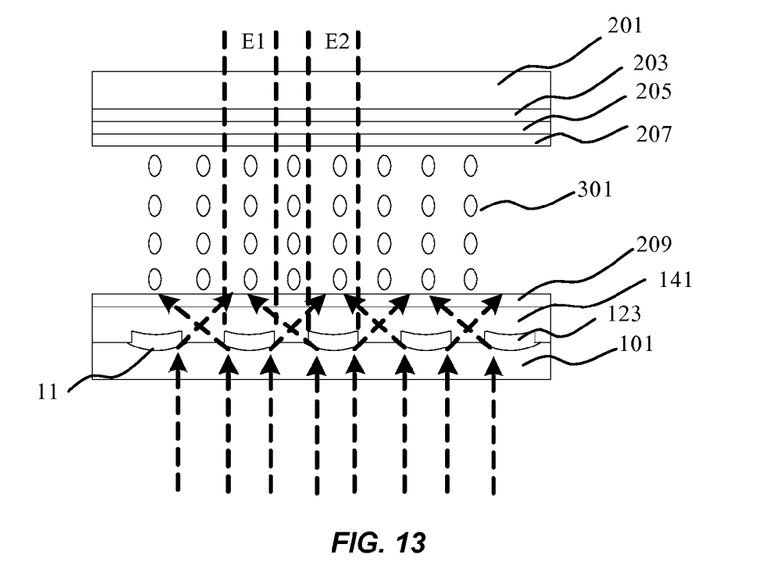
FIG. 13 is a schematic view showing light paths in a liquid crystal display device according to an embodiment of the present disclosure.

To be more specific, reference can be made to FIGS. 12 and 13. FIG. 12 is a simple schematic view showing the structure of a traditional liquid crystal display device 1. The liquid crystal display device 1 includes: a first substrate 101, a second substrate 201 disposed opposite to the first substrate 101, and a display function layer 301 disposed between the first substrate 101 and the second substrate 201, where a TFT layer 141 and a first alignment film layer 209 are sequentially formed on the first substrate 101, and a black matrix layer 203, a color filter layer 205 and a second alignment film layer 207 are sequentially formed on the second substrate 201. The first alignment film layer 209 and the second alignment film layer 207 are made of photosensitive material and have a thickness from 10 nm to 150 nm, and an alignment direction of the first alignment film layer 209 is the same as that of the second alignment film layer 207. In the embodiments of the present disclosure, the first substrate 101 is an array substrate, the second, substrate is a color filter substrate, and the display function layer 301 is a liquid crystal layer. The TFT layer 141 includes a gate electrode metal layer (winch is illustrative in FIG. 12, and other specific films are possible but omitted for the sake of description), which includes a plurality of gate lines 123. As can be seen from FIG. 12, both the upper surface and the lower surface of each of the gate lines in FIG. 12 are planar, thus, when the light irradiates the gate lines 123 from a side of the array substrate 101 in a direction perpendicular to the array substrate 101, the light cannot transmit through the gate lines 123 and cannot be reflected to either side of the gate lines 123 because the gate lines 123 are made of metal. Therefore, regions (e.g., within a region E) of the first and second alignment film layers 209 and 207, which are overlapped with the gate lines 123 in a direction perpendicular to the array substrate 101, cannot be irradiated by the light, that is, cannot be subjected to the photo-alignment. Only region (e.g., within a region F) of the first and second alignment film layers 209 and 207, which are not overlapped with the gate lines 123 in the direction perpendicular to the array substrate 101, can be irradiated by the light, that is, can be subjected to the photo-alignment. As such, for the entire liquid crystal display device, the photo-alignment performed on any regions at positions with the presence of the gate lines 123 would be affected.

Next, referring to FIG. 13 which is a schematic view showing a liquid crystal display device provided by an embodiment of the present disclosure. FIG. 13 is different from FIG. 12 in terms of the shapes of the gate lines 123. Since the gate lines 123 are provided with a first protrusion 11, when irradiating the first protrusions 11 of the gate lines 123 from a side of the array substrate 101, the light is reflected by the first protrusions 11, and the reflected light can irradiates the first alignment film layer 209 and the second alignment film layer 207 shielded by the nearby gate lines 123 in the vertical direction. For example, regions of the first alignment film layer 209 and the second alignment film layer 207, which are shielded by the gate line 123 for example within an E1 region, can be irradiated for photo-alignment by the light reflected from the gate line 123 in the adjacent E2 region, and so on, so that the photo-alignment for the whole first alignment film layer 209 and the whole second alignment film layer 207 can be performed, without regions of the first alignment film layer 209 and the second alignment film layer 207 which are not subjected to the photo-alignment.

In the present embodiment, the light transmission in the liquid crystal display device shown in FIG. 13 is described with an example of the gate lines 123. In practice, however, the disclosure is not limited to the arrangement of the first protrusions 11 on the gate lines 123 for the reflection of the incident light. Similarly, as described above, the second protrusions 22 are disposed on the data lines 109 or the third protrusions 33 are disposed on the first metal lines 127, for the reflection of the incident light to the second protrusions 22 and the third protrusions 33. In an actual manufactured liquid crystal display device, not only the first protrusions 11 may be disposed on the gate lines 123, but also the second protrusions 22 may be disposed on the data lines 109 or the third protrusions 33 may be disposed on the first metal lines 127, so that the reflection of the incident light can be more efficiently achieved, that is, the photo-alignment can be achieved better. Alternatively, it is possible that only the first protrusions 11 are disposed on the gate lines 123, or only the second protrusions 22 are disposed on the data lines 109, or only the third protrusions 33 are disposed on the first metal lines 127, which will be not discussed again herein.

Similarly, it should be noted that, although FIG. 13 shows that the gate line 123 is provided with only one first protrusion 11, which has a circular arc shape and is located at an entire surface on a side of the gate lines 123 that faces the first substrate 101, the number, shape and position of the first protrusion 11 can be modified as above described referring to FIGS. 7 and 8 and are not limited to the arrangement in FIG. 13, which will not be described herein.

Next, the advantage of the arrangement of the first protrusion 11 on the gate line 123 and/or the arrangement of the second protrusion 22 or the third protrusion 33 on the data line 109 or the first metal line 127 for the photo-alignment of the whole liquid crystal display device is described in combination with FIG. 2. In FIG. 2, a plurality of dashed boxes G extending along a direction x and a plurality of dashed boxes D extending along a direction y are schematically shown, the gate lines 123 and/or the data lines 109 or the first metal lines 127 enclosed by the dashed boxes G and/or dashed boxes D are provided with the first protrusions 11 and/or the second protrusions 22 or the third protrusions 33 as shown in FIGS. 7 to 10. When the light irradiates regions of the dashed boxes G and/or the dashed boxes D from a direction perpendicular to the liquid crystal display device, the light can be reflected to the periphery of the dashed box G and/or the dashed box D due to the presence of the first protrusions 11 and/or the second protrusions 22 or the third protrusions 33, so that the photo-alignment on the periphery of the dashed boxes G and/or the dashed boxes D can be achieved.

It should be noted that in FIG. 2, the first protrusions 11 and/or the second protrusions 22 or the third protrusions 33 are not disposed on the entire gate line 123 and/or the entire data line 109 or the entire first metal line 127 extending through the entire display region of the liquid crystal display device, instead, the first protrusions 11 and/or the second protrusions 22 or the third protrusions 33 are illustratively provided at the regions of the dashed box G and/or dashed box D; this is because that regions of TFTs are generally shielded by a black matrix (BM) in the prior design. Therefore, even though the light irradiating the region of the TFT is not reflected to the periphery of the TFT, the overall display effect of the liquid crystal display device will not be affected. Alternatively, the first protrusions 11 and/or the second protrusions 22 or the third protrusions 33 may be disposed on the entire gate line 123 and/or the entire data line 109 or the entire first metal line 127, without being limited to the regions of the dashed box G and/or the dashed box D.

Figure 14A:
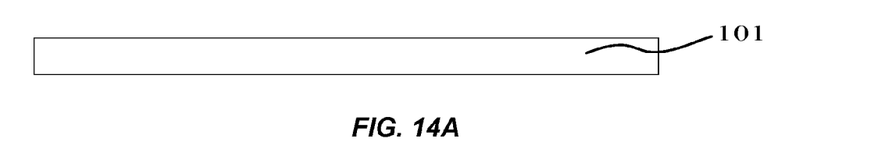
FIGS. 14A to 14F show a flow chart of manufacturing a Thin-Film Transistor (TFT) layer in a liquid crystal display device according to an embodiment of the present disclosure.
Figure 14B:
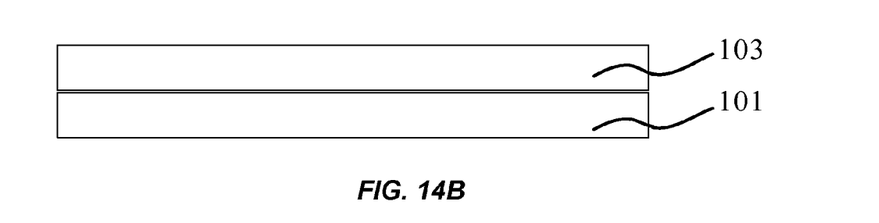
Figure 14C:
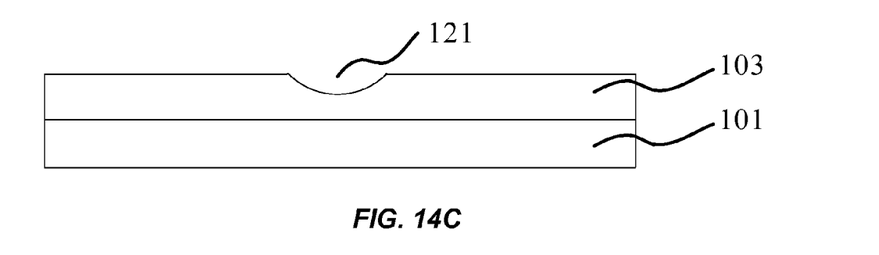
Figure 14D:
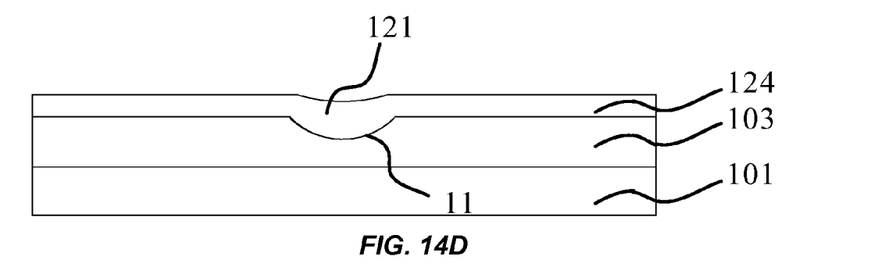
Figure 14E:
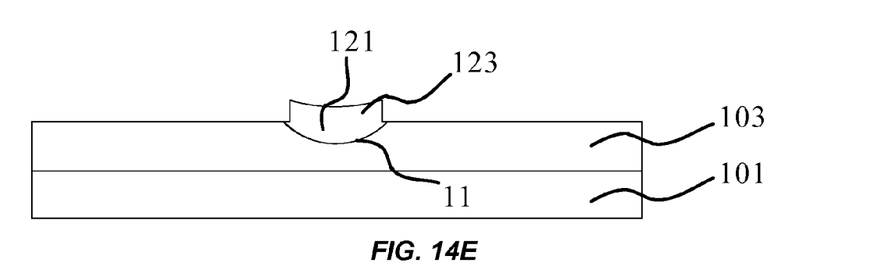
Figure 14F:
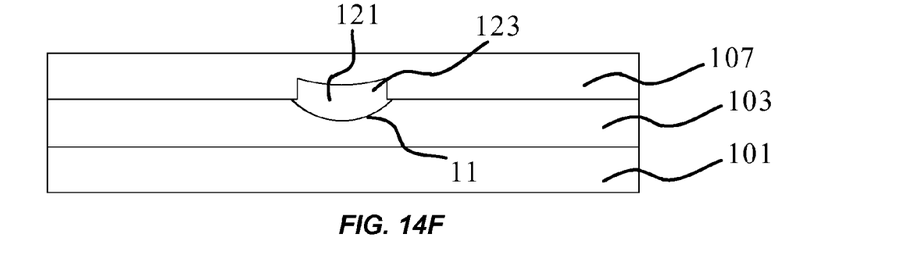

Next, a flow chart of manufacturing a TFT layer with a cross-section taken along the line BB' will be described in detail in combination with FIGS. 14A to 14F. The manufacturing process includes steps of: providing a first substrate 101, winch may be an array substrate and is generally made by a glass substrate, as shown in FIG. 14A; forming a first insulation layer 103 on the first substrate 101, as shown in FIG. 14B; etching the first insulation layer 103 and forming a first groove 121 on the first insulation layer 103, as shown in FIG. 14C; forming a gate electrode metal layer 124 on the first insulation layer 103, where an insignificant groove (similar to the first groove 121) is formed on a portion of the gate electrode metal layer 124 that covers the first groove 121, on a side of the gate electrode metal layer 124 that is away from the first substrate 101, as shown in FIG. 14D; patterning the gate electrode metal layer 124 to form gate lines 123, where the gate line 123 covers at least a portion of the first groove 121, there is a first protrusion 11 (facing the first groove 121) on a side of the gate line 123 that faces the first substrate 101, and the first protrusion 11 corresponds to the first groove 121, as shown in FIG. 14E; and forming a gate electrode insulation layer 107 above the gate lines 123, where the gate electrode insulation layer 107 covers both the gate lines 123 and the first insulation layer 103, as shown in FIG. 14F. Specifically, the shape of the first protrusion 11 is not limited to the circular arc shape shown in FIGS. 14A to 14F, but may be a triangle shape or other irregular shapes, as long as the light incident to the first protrusion 11 of the gate line 123 can be reflected to the peripheral region of the gate line 123, which can refer to the above illustration and will not be described again herein.

Figure 15A:
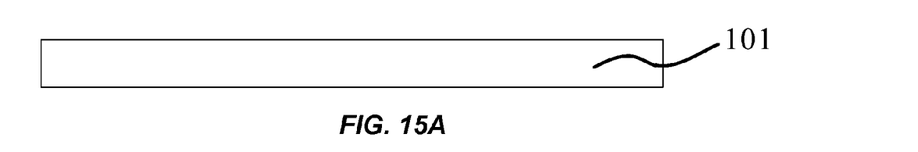
FIGS. 15A to 15H show a flow chart of manufacturing a TFT layer in a liquid crystal display device according to an embodiment of the preset disclosure.
Figure 15B:
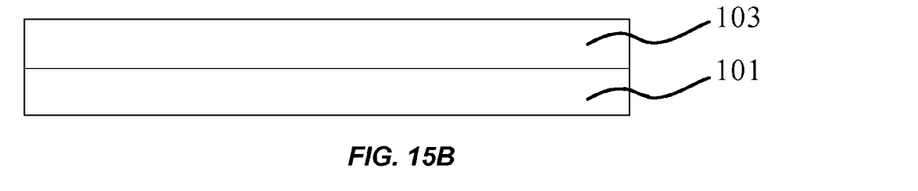
Figure 15C:
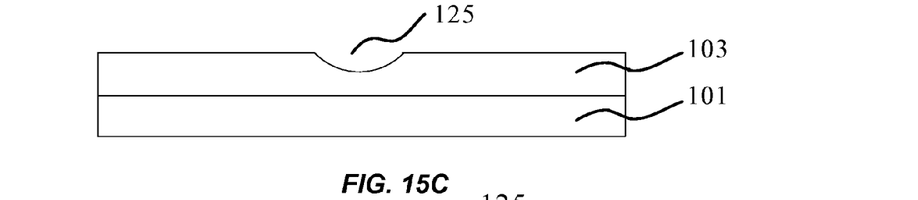
Figures 15D, 15E:
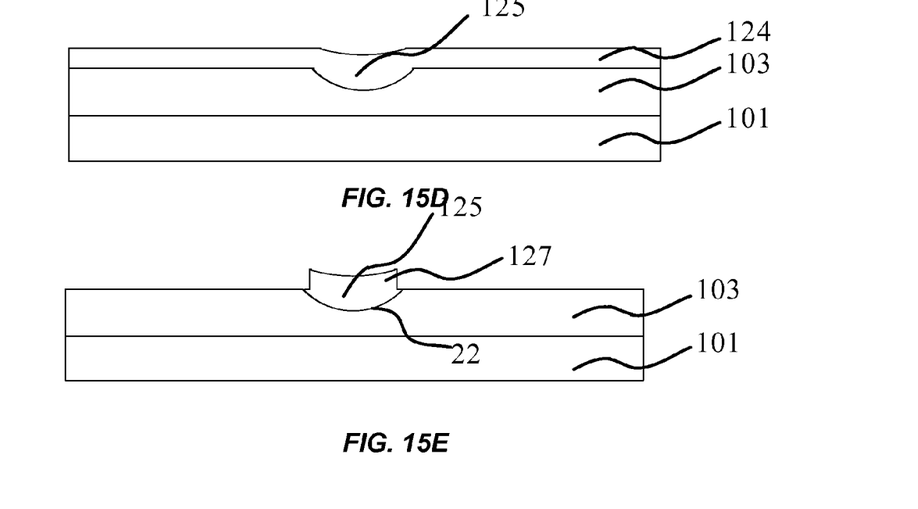
Figure 15F:
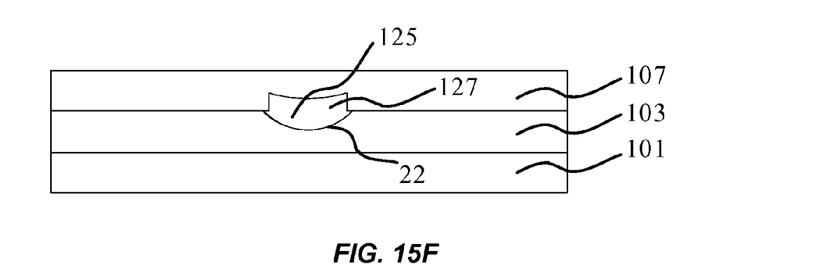
Figure 15G:
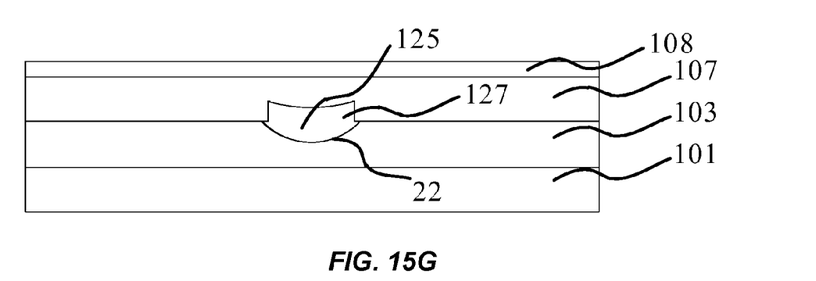
Figure 15H:
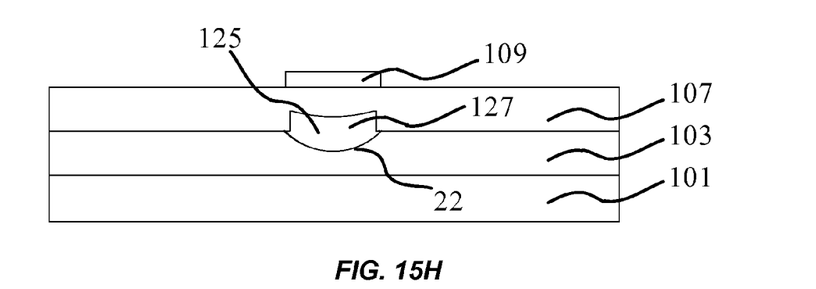

Next, a flow chart of manufacturing a TFT layer with a cross-section taken along the line CC' will be described in detail in combination with FIGS. 15A to 15F. The manufacturing process includes steps of: providing a first substrate 101, which may be an array substrate and is generally made by a glass substrate, as shown in FIG. 15A; forming a first insulation layer 103 on the first substrate 101, as shown in FIG. 15B; etching the first insulation 103 and forming a second groove 125 on the first insulation layer 103, as shown in FIG. 15C; forming a gate electrode metal layer 124 on the first insulation layer 103, where an insignificant groove (similar to the second groove 125) is formed on a portion of the gate electrode metal layer 124 that covers the second groove 125, on a side of the gate electrode metal layer 124 that is away from the first substrate 101, as shown in FIG. 15D; patterning the gate electrode metal layer 124 to form first metal lines 127, where the first metal line 127 covers at least a portion of the second groove 125, there is a second protrusion 22 (facing the second groove 125) on a side of the first metal line 127 that faces the first substrate 101, and the second protrusion 22 corresponds to the second groove 121, as shown in FIG. 15E; forming a gate oxide layer 107 above the first metal lines 127, where the gate oxide layer 107 covers both the first metal lines 127 and the first insulation layer 103, as shown in FIG. 15F; forming a source/drain electrode metal layer 108 on the gate oxide layer 107, where the source/drain electrode metal layer 108 covers the gate oxide layer 107, as shown in FIG. 15G; and patterning the source/drain electrode metal layer 108 to form data lines 109, as shown in FIG. 15H, where the data line 109 overlaps at least a part of the first metal line 127 in a direction perpendicular to the first substrate 101. Similarly, the shape of the second protrusion 22 mentioned above is not limited to the circular arc shape shown in FIGS. 15A to 15H, but may be a triangle shape or other irregular shapes, as long as the light incident to the second protrusion 22 can be reflected to peripheral region of the data line 109. Reference can be made to the preceding contents mentioned above, which will not described herein.

Figure 16A:
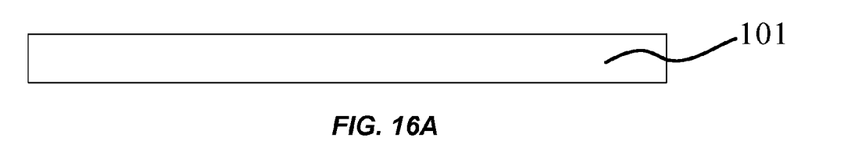
FIGS. 16A to 16F show a flow chart of manufacturing another TFT layer in a liquid crystal display device according to an embodiment of the present disclosure.
Figure 16B:
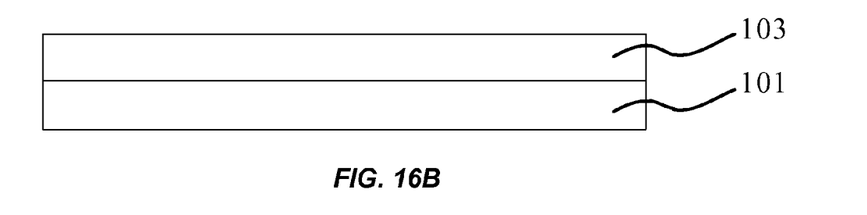
Figure 16C:
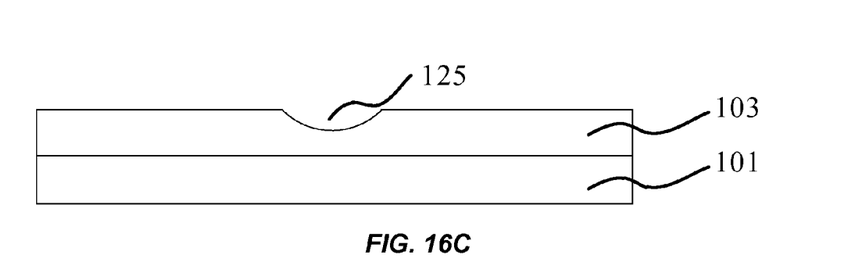
Figure 16D:
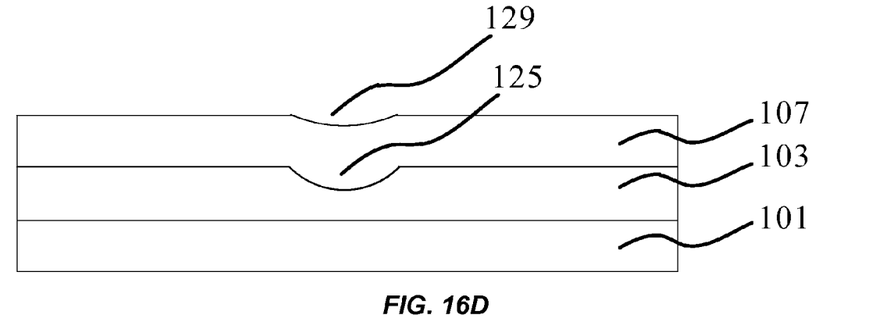
Figure 16E:
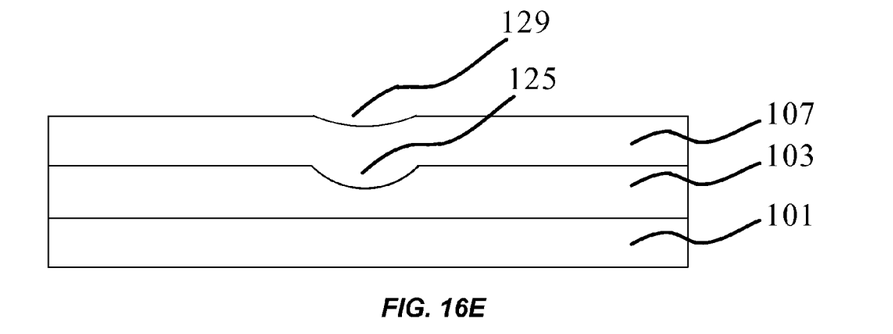
Figure 16F:
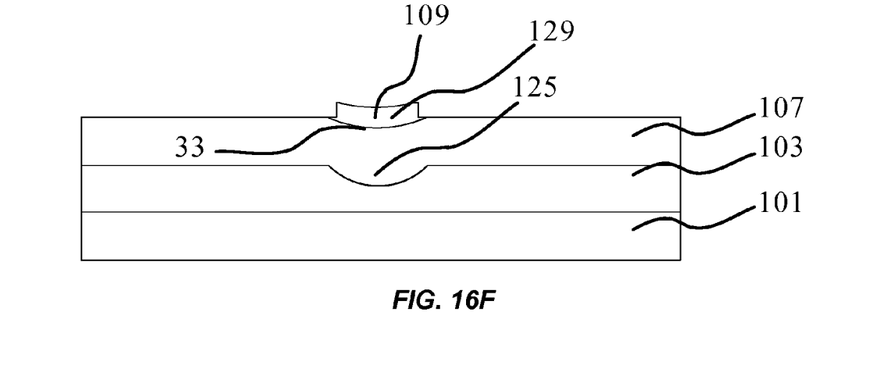

Next, a flow chart of manufacturing a TFT layer with a cross-section taken along the line CC' will be described in detail in combination with FIGS. 16A to 16F. The manufacturing process includes steps of: providing a first substrate 101, which may be an array substrate and is generally made by a glass substrate, as shown in FIG. 16A; forming a first insulation layer 103 on the first substrate 101, as shown in FIG. 16B; etching the first insulation 103 to form a second groove 125 on the first insulation layer 103, as shown in FIG. 16C; forming a gate electrode insulation layer 107 on the first insulation layer 103, where a fake second groove 129 (similar to the second groove 125) is formed on a portion of the gate electrode insulation layer 107 that covers the second groove 125, on a side of the gate electrode insulation layer 107 that is away from the first substrate 101, as shown in FIG. 16D; forming a source/drain electrode metal layer 108 on the gate electrode insulation layer 107, where the source/drain electrode metal layer 108 covers the gate electrode insulation layer 107, as shown in FIG. 16E; and patterning the source/drain electrode metal layer 108 to form data lines 109, where the data line 109 is at least partly formed in the take second groove 129, as shown in FIG. 16F. Since the shape of the fake second groove 129 is similar to that of the second groove 125, a third protrusion 33 corresponding to the fake second groove 129 is formed on a surface at a side of the data line 109 that faces the first substrate 101. Similarly, the shape of the third protrusion 33 is not limited to the circular arc shape shown in FIGS. 16A to 16H, and can be a triangle shape or other irregular shapes, as long as the light incident to the third protrusion 33 can be reflected to a peripheral region of the data line 109. Reference can be made to the preceding contents mentioned above, which will not described herein.

As such, according to the manufacturing processes as shown in FIGS. 14A to 14F and/or FIGS. 15A to 15H or FIGS. 16A to 16F, the gate lines 123 including the first protrusions 11 can be manufactured on the TFT layer 141, and the first metal lines 127 including the second protrusions 22 can be manufactured on the TFT layer 141 or the data lines 109 including the third protrusions 33 can be manufactured on the TFT layer 141. For such TFT layer 141, steps of the photo-alignment will be described in detail in combination with FIG. 17, and includes: a first step S1 of providing a first substrate 101 and a second substrate 102; a second step S2 of forming a TFT layer 141 on the first substrate 101, where the TFT layer 141 includes the gate fines 123 with the first protrusions 11, and/or the TFT layer 141 includes the first metal lines 127 with the second protrusions 22 or the TFT layer 141 includes the data lines with the third protrusions 33, and sequentially forming a black matrix layer 203 and a color filter layer 205 on the second substrate 201; a third step S3 of forming a first alignment film 209 on the TFT layer 141 and forming a second alignment film 207 on the color filter layer 205; a fourth step S4 of injecting liquid crystals between the first substrate 101 and the second substrate 201 to form a liquid crystal cell; a fifth step S5 of applying an electric field between the first substrate 101 and the second substrate 201 to orient the liquid crystal molecules in a liquid crystal layer 301 in such a predetermined direction that the polarization direction of the polarized light will not be affected by the liquid crystal molecules, a reason for this lies in that: when the light irradiates in a direction perpendicular to the liquid crystal display device, (e.g., a direction from the first substrate 101 to the second substrate 201), considering that after the light is used for the photo-alignment performed on the first alignment film layer 209 located on a side of the first substrate 101, the light needs to transmit through the liquid crystal layer 301 to perform the photo-alignment on the second alignment film layer 207, if the liquid crystal molecules are not oriented in order (i.e. the liquid crystal molecules are out of order), then the orderless liquid crystal molecules would affect the polarization direction of the light, thereby causing the alignment directions of the first alignment film layer 209 and the second alignment film layer 207 to be different from each other, which would significantly affect a display effect of the liquid crystal display device, and in view of this, before the photo-alignment is performed, the electric field is applied to the liquid crystal layer 301 so that the liquid crystal molecules are oriented in the predetermined direction to avoid an affection on the polarization direction of the polarized light; and a sixth step S6 of starting irradiation by polarized light onto a side of the first substrate 101 that is away from the second substrate 201, where the wavelength of the polarized light is in a range from 300 nm to 380 nm, and the transmittance of the polarized light through the first alignment film layer is equal to or larger than 50%.

Figure 17:
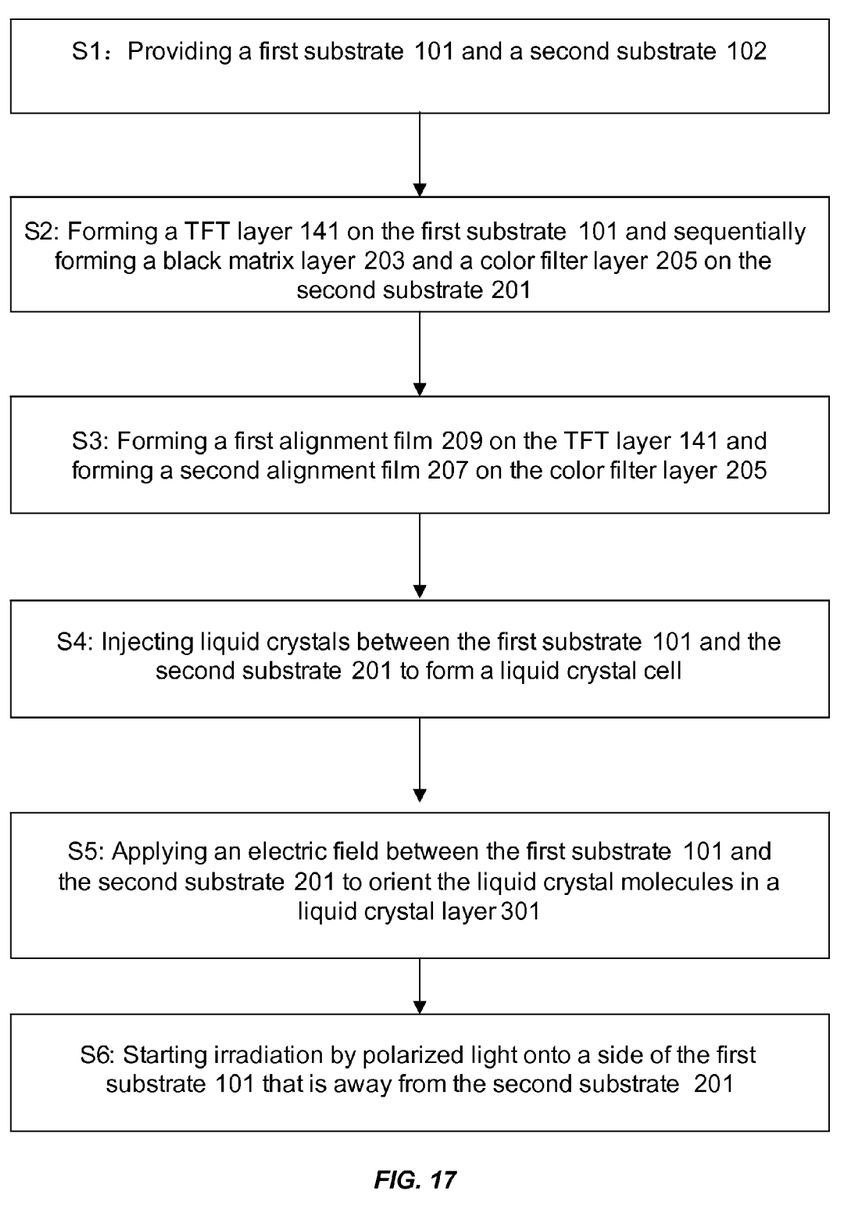
FIG. 17 shows a flow chart of an entire photo-alignment process according to an embodiment of the present disclosure.
Figure 18:
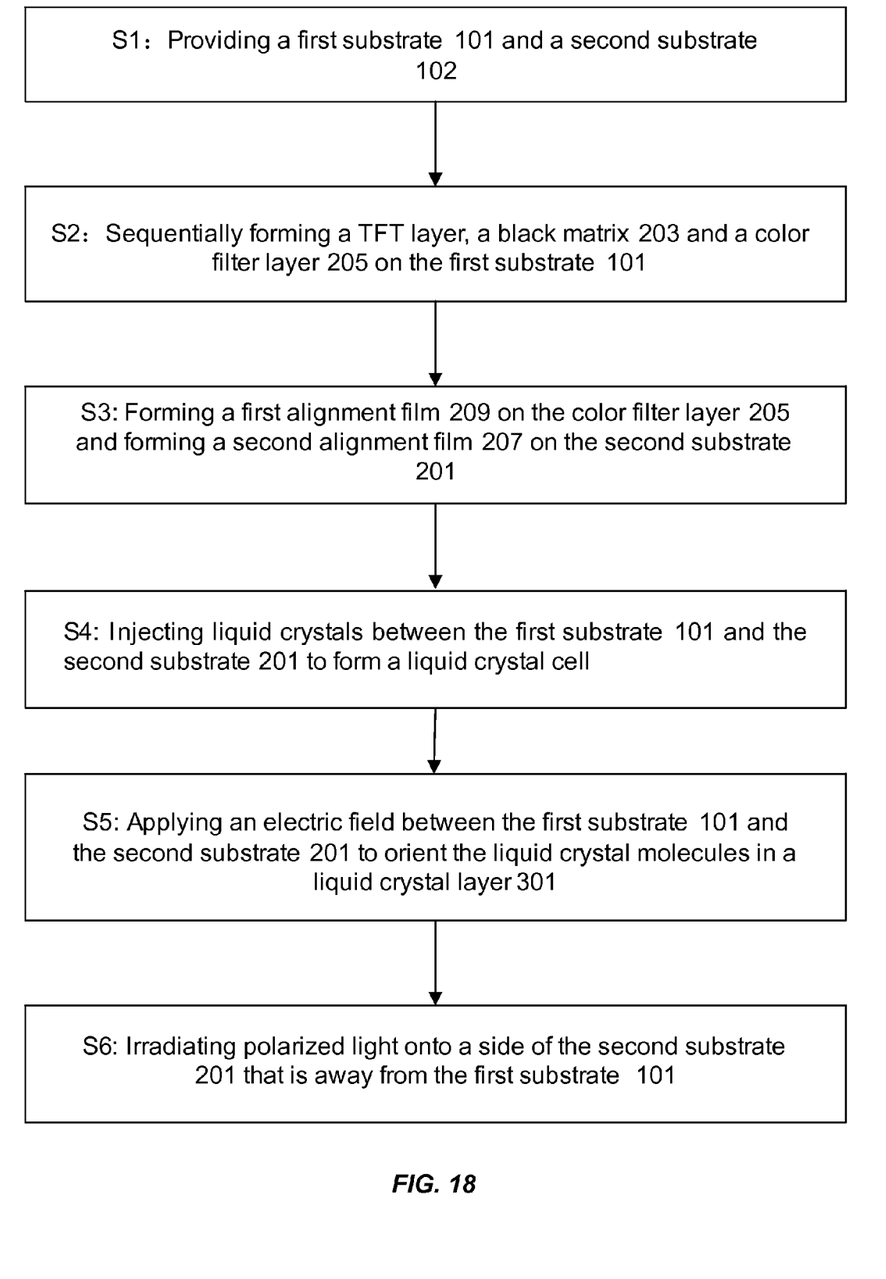
FIG. 18 shows a flow chart of another entire photo-alignment process according to an embodiment of the present disclosure.

If the design of the above TFT layer 141 is not adopted, that is, the gate lines 123 and/or the first metal lines 127 or the data fines 109 in the TFT layer do not include the first protrusions 11 and/or the second protrusions 22 or the third protrusions 33, or if the structure of the traditional TFT layer of the liquid crystal display device is adopted, another photo-alignment process that will be described in detail in combination with FIG. 18 is adopted and includes: a first step S1 of providing a first substrate 101 and a second substrate 102; a second step S2 of sequentially forming a TFT layer (i.e. a traditional TFT layer without protrusions), a black matrix 203 and a color filter layer 205; a third step S3 of forming a first alignment film 209 on the color filter layer 205 and forming a second alignment film 207 on the second substrate 201; a fourth step S4 of injecting liquid crystals between the first substrate 101 and the second substrate 201 to form a liquid crystal cell; a fifth step S5 of applying an electric field between the first substrate 101 and the second substrate 201 to orient the liquid crystal molecules in a liquid crystal layer 301 in such a predetermined direction that the polarization direction of the polarized light will not be affected by the liquid crystal molecules, that is, the function of the predetermined direction can refer to the corresponding explanation with respect to FIG. 17, which will not be described herein; and a sixth step S6 of irradiating polarized light onto a side of the second substrate 201 that is away from the first substrate 101, where the wavelength of the polarized light is in a range from 300 nm to 380 nm, and the transmittance of the polarized light through the first alignment film layer is equal to or larger than 50%.

As can be seen from the above, with the liquid crystal display device and the manufacturing thereof as well as the photo-alignment process, the polarized light is irradiated from a single side of the substrate while two alignment film layers at both sides of the liquid crystal device are subjected to the photo-alignment. As compared with the traditional photo-alignment requiring for light irradiated at both sides of the liquid crystal device, the present disclosure save a light irradiation step, thereby increasing the productivity.

The liquid crystal display device and the manufacturing thereof as well as the photo-alignment process of the present disclosure have been described as above. In the present disclosure, the specific examples have been used to describe the principle and the implementation of the present disclosure, the descriptions for the above embodiments are only used to understand the method and concept of the present disclosure; meanwhile, modifications and improvements to the embodiments and applications thereof can be made by those skilled in the art in view of the disclosure, therefore the contents disclosed herein should not be considered as a limitation to the present disclosure.

What is claimed is:

1. A liquid crystal display device, comprising:
   a first substrate;
   a second substrate opposite to the first substrate;
   a TFT layer on the first substrate, wherein the TFT layer comprises:
      a gate electrode metal layer; and
      a source/drain electrode metal layer, wherein the source/drain electrode metal layer overlaps the gate electrode metal layer;
   a first alignment film layer on a side of the first substrate that faces the second substrate, and on a side of the second substrate that faces the first substrate;
   a second alignment film layer disposed on the second substrate; and
   at least one protrusion formed on at least one of the gate electrode metal layer and the source/drain electrode metal layer, wherein the protrusion faces toward the first substrate, and wherein the protrusion is configured to reflect incident light from a side of the first substrate, an alignment direction of the first alignment film layer disposed on the first substrate is the same as that of the second alignment film layer.

2. The liquid crystal display device of claim 1, wherein a first insulation layer is disposed on the first substrate and is located between the first substrate and the gate electrode metal layer, and a plurality of first grooves and/or a plurality of second grooves are disposed on a side of the first insulation layer that faces the second substrate.

3. The liquid crystal display device of claim 2, wherein the gate electrode metal layer comprises a plurality of gate lines, the source/drain electrode metal layer comprises a plurality of data lines,
   projections of the first grooves at least partly overlap projections of the gate lines in a vertical direction, and
   projections of the data lines at least partly overlap projections of the second grooves in the vertical direction.

4. The liquid crystal display device of claim 3, wherein the gate electrode metal layer comprises first metal lines located between the data lines and the first insulation layer, and
   projections of the first metal lines at least partly overlap the projections of the data lines in the vertical direction.

5. The liquid crystal display device of claim 4, wherein the number of the protrusions is equal to one, and the one protrusion is located at an entire surface on a side of the gate lines, the first metal lines or the data lines that faces the first substrate.

6. The liquid crystal display device of claim 4, wherein at least one protrusion is provided at an edge on a side the gate lines, the first metal lines or the data lines that faces the first substrate.

7. The liquid crystal display device of claim 5, wherein the protrusion has an arc shape or a triangle shape.

8. The liquid crystal display device of claim 1, further comprising
   a color filter layer and a black matrix layer, which are located on the first substrate or the second substrate.

9. The liquid crystal display device of claim 1, wherein the first alignment film layer is made of photosensitive material.

10. The liquid crystal display device of claim 1, wherein a thickness of the first alignment film layer is between about 10 nm and 150 nm.

11. A method for manufacturing a liquid crystal display device, the method comprising:
   providing first and second substrates, wherein the second substrate is opposite to the first substrate;
   forming a color filter layer and a black matrix layer on the second substrate;
   forming a TFT layer on the first substrate including,
      forming a first insulation layer on the first substrate;
      patterning the first insulation layer to form a plurality of second grooves on the first insulation layer;
      forming the gate electrode metal layer on the first insulation layer, patterning the gate electrode metal layer to form first metal lines on the second grooves, wherein projections of the second grooves at least partly overlap projections of the first metal lines in a vertical direction;
      forming a gate electrode insulation layer above the first metal lines;
      forming a semiconductor layer on the gate electrode insulation layer, forming the source/drain electrode metal layer on the semiconductor layer, and patterning the source/drain electrode metal layer to form source and drain electrodes and data lines, wherein projections of the data lines at least partly overlap projections of the first metal lines in a vertical direction;
   forming an alignment film layer on the TFT layer and on the second substrate;
   arranging the first substrate and the second substrate to form a liquid crystal cell; and starting irradiation by applying polarized light onto a side of the first substrate to supply an alignment energy to the alignment film layer.

12. The method of claim 11, wherein
forming the TFT layer on the first substrate further comprises:
forming a plurality of first grooves on the first insulation layer, wherein gate lines in the gate electrode metal layer are formed on the first grooves, and projections of the first grooves at least partly overlap projections of the gate lines in a vertical direction.

13. The method of claim 11, wherein
a liquid crystal layer is located between the first substrate and the second substrate, and after arranging the first substrate and the second substrate to form a liquid crystal cell and before starting irradiation by polarized light onto a side of the first substrate, the method further comprises:
applying an electric field between the first substrate and the second substrate, wherein the electric field is configured to orient liquid crystal molecules to be parallel to a direction of the polarized light.

14. A method of claim 11, further comprising:
forming a color filter layer and a black matrix layer on the TFT layer;
forming an alignment film layer on the color filter layer and on the black matrix layer; and
starting irradiation by polarized light onto a side of the second substrate to supply an alignment energy to the alignment film layer.

15. The method of claim 14, wherein
a liquid crystal layer is located between the first substrate and the second substrate, and after arranging the first substrate and the second substrate to form a liquid crystal cell, and before starting irradiation by polarized light onto a side of the second substrate, the method further comprises:
applying an electric field between the first substrate and the second substrate, wherein the electric field is configured to orient liquid crystal molecules to be parallel to a direction of the polarized light.

16. The method of claim 14, wherein
a wavelength of the polarized light is between about 300 nm and 380 nm, and transmittance of the polarized light through the alignment film layer is equal to or larger than about 50%.

* * * * *